United States Patent
Watanabe et al.

(10) Patent No.: US 6,818,148 B1
(45) Date of Patent: Nov. 16, 2004

(54) RESIST COMPOSITION AND PATTERNING METHOD

(75) Inventors: Satoshi Watanabe, Nakakubiki-gun (JP); Toyohisa Sakurada, Nakakubiki-gun (JP); Yoshitaka Yanagi, Nakakubiki-gun (JP); Shigehiro Nagura, Nakakubiki-gun (JP); Toshinobu Ishihara, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/401,490

(22) Filed: Sep. 22, 1999

(30) Foreign Application Priority Data

Sep. 22, 1998 (JP) .......................................... 10-267855

(51) Int. Cl.[7] .............................................. C09K 13/00
(52) U.S. Cl. .................... 252/79.1; 252/79.3; 252/79.4; 430/270.1; 430/273.1
(58) Field of Search ............................... 252/79.1, 79.3, 252/79.4; 430/270.1, 273.1, 190; 438/689, 690, 691, 692

(56) References Cited

U.S. PATENT DOCUMENTS

| | | | | |
|---|---|---|---|---|
| 4,657,959 A | * | 4/1987 | Bryan et al. | 524/266 |
| 5,159,105 A | * | 10/1992 | Hansen et al. | 560/125 |
| 5,274,159 A | * | 12/1993 | Pellerite et al. | 556/485 |
| 5,300,358 A | * | 4/1994 | Evers | 428/286 |
| 5,695,906 A | * | 12/1997 | Nishi et al. | 430/190 |
| 5,714,082 A | * | 2/1998 | Boardman et al. | 252/8.62 |
| 5,820,978 A | * | 10/1998 | Huang | 428/331 |
| 5,849,808 A | * | 12/1998 | Schacht et al. | 522/31 |
| 6,136,500 A | * | 10/2000 | Kobayashi et al. | 430/270.1 |

OTHER PUBLICATIONS

Seimi Chemical Co., Ltd Products http://www.seimichemical.co.jp/e/product/fluorine/sarfron.htm pp. 1–4.*

Seimi Chemical Co., Ltd History http://www.seimichemical.co.jp/e/company/history.htm pp. 1–2.*

* cited by examiner

Primary Examiner—Nadine G. Norton
Assistant Examiner—Binh X. Tran
(74) Attorney, Agent, or Firm—Millen White Zelano & Branigan, P.C.

(57) ABSTRACT

A resist composition is provided comprising a fluorochemical surfactant which functions to reduce the contact angle of a coating of the resist composition with water or an aqueous base developer as the amount of the fluorochemical surfactant increases. The resist composition forms a coating having a thickness uniformity, free of defects, and wettable with an aqueous base developer when applied onto a substrate, and has a good storage stability in that particles do not increase during storage in solution form.

12 Claims, 1 Drawing Sheet

RESIST COMPOSITION AND PATTERNING METHOD

This invention relates to a novel resist composition adapted for microfabrication, and a patterning method.

BACKGROUND OF THE INVENTION

A number of efforts are currently made to achieve a finer pattern rule in the drive for higher integration and operating speeds in LSI devices. Deep-ultraviolet, x-ray and electron beam lithography processes are thought to hold particular promise as the next generation in microfabrication technology. Deep-UV lithography is capable of pattern generation to dimensions of 0.25 μm or less and, when a resist material having low light absorption is used, can form patterns with sidewalls that are nearly vertical to the substrate. One technology that has attracted a good deal of attention recently utilizes a high-intensity KrF or ArF excimer laser as the deep-UV light source. Resist materials with low light absorption and high sensitivity are needed to successfully apply this technology to large-volume production.

In conjunction with the demand for higher integration, higher operating speeds and finer pattern rules in LSI devices, an attempt has also been made to increase the diameter of substrates. There is a desire to have a resist composition which when applied to current mainstream 8-inch substrates, forms a coating having a thickness uniformity, free of defects, and wettable with an aqueous base developer, and which has a good storage stability in that particles do not increase during storage in solution form.

In light of this, acid-catalyzed chemical amplification type resist materials were recently developed. As the large-scale manufacture technology of these resist materials advances, their problems of applicability, wettability and storage stability become outstanding.

SUMMARY OF THE INVENTION

An object of the invention is to provide a novel and improved resist composition which when combined with large-scale manufacture technology, forms a coating having a thickness uniformity, free of defects, and wettable with an aqueous base developer, and which has a good storage stability in that particles do not increase during storage in solution form. Another object is to provide a patterning method using the resist composition.

According to the invention, there is provided a resist composition comprising a fluorochemical surfactant. When the resist composition is coated onto a substrate to form a coating, fluorochemical surfactant functions to reduce the contact angle at the interface between the surface of the resist coating and water or an aqueous base developer as the amount of the fluorochemical surfactant added increases. The fluorochemical surfactant is preferably of the general formula (1) defined later. This resist composition eliminates the inconveniences of resist material with respect to applicability, wettability, and storage stability.

BRIEF DESCRIPTION OF THE DRAWING

The only figure.

DESCRIPTION OF THE PREFERRED EMBODIMENT

Figure 1:
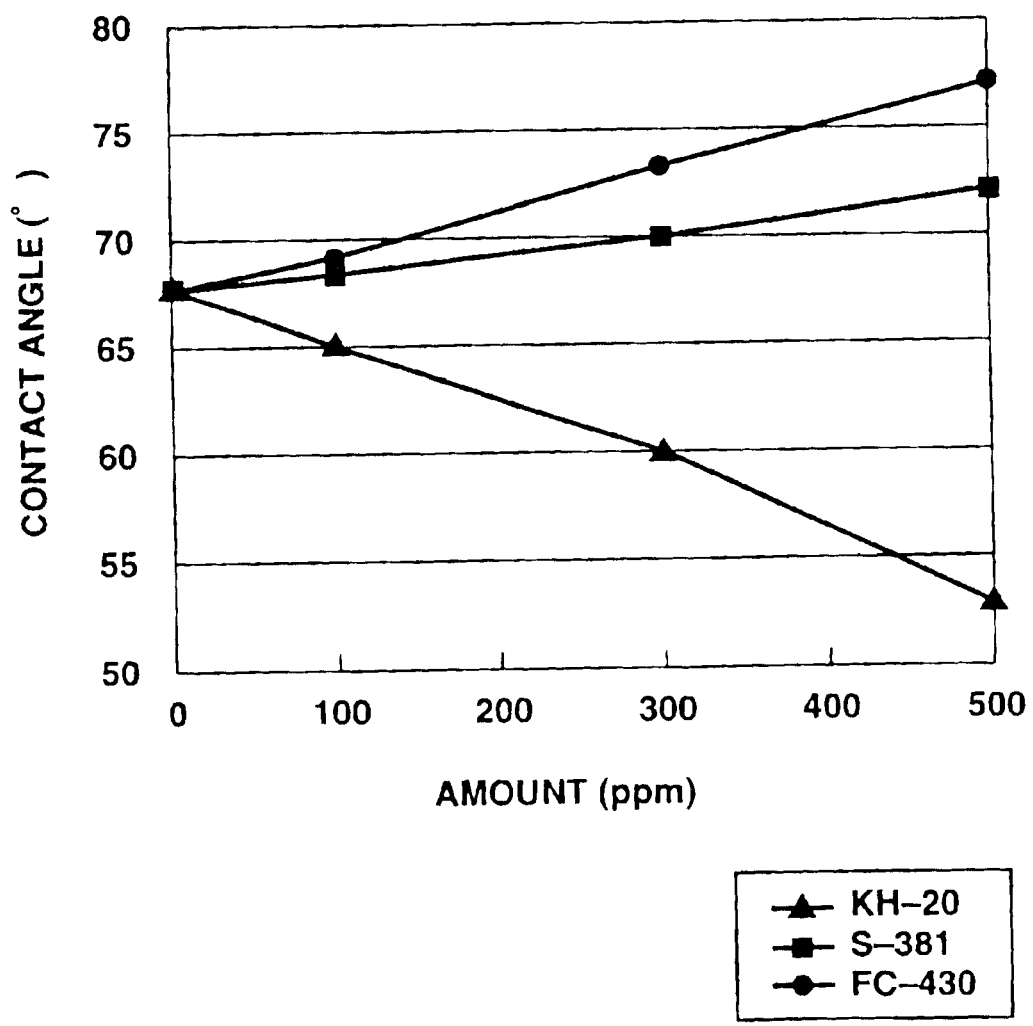
FIG. 1 is a graph showing the contact angle of resist compositions as a function of the amount of a fluorochemical surfactant added.

The resist composition of the invention contains a fluorochemical surfactant which functions such that the contact angle at the interface between the surface of the resist composition coated onto a substrate and water or an aqueous base developer decreases as the amount of the fluorochemical surfactant added increases.

The fluorochemical surfactant is preferably of the following general formula (1).

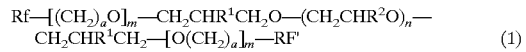

$$Rf-[(CH_2)_aO]_m-CH_2CHR^1CH_2O-(CH_2CHR^2O)_n-CH_2CHR^1CH_2-[O(CH_2)_a]_m-Rf' \quad (1)$$

$R^1$ is hydrogen, a hydroxyl group, a straight, ranched or cyclic alkoxy group of 1 to 6 carbon atoms, or an alkylcarbonyloxy group whose alkyl moiety has 1 to 6 carbon atoms, $R^2$ is hydrogen or a straight, branched or cyclic alkyl group of 1 to 6 carbon atoms, a is a positive integer of 0 to 6, m is equal to 0 or 1, and n is a positive integer of 1 to 40, each of Rf and Rf', which may be the same or different, is a straight, branched or cyclic fluoroalkyl group having 1 to 12 carbon atoms, in which all groups attached to its carbon atoms are fluorine atoms or some are fluorine atoms and the remainder are hydrogen atoms.

The substituents in formula (1) are described in more detail. $R^1$ is hydrogen, a hydroxyl group, a straight, branched or cyclic alkoxy group of 1 to 6 carbon atoms, or an alkylcarbonyloxy group whose alkyl moiety has 1 to 6 carbon atoms, preferably a hydroxyl group or a straight, branched or cyclic alkylcarbonyloxy group whose alkyl moiety has 1 to 6 carbon atoms. Examples of the straight, branched or cyclic $C_{1-6}$ alkyl group include methyl, ethyl, n-propyl, isopropyl, n-butyl, isobutyl, tert-butyl, n-pentyl, isopentyl, hexyl, cyclopentyl, and cyclohexyl. Preferably $R^1$ is hydroxyl, methoxy or acetoxy.

$R^2$ is hydrogen or a straight, branched or cyclic alkyl group of 1 to 6 carbon atoms, preferably hydrogen or a straight or branched alkyl group of 1 to 3 carbon atoms, more preferably hydrogen or a straight alkyl group of 1 to 2 carbon atoms. Examples of the straight, branched or cyclic $C_{1-6}$ alkyl group include methyl, ethyl, n-propyl, isopropyl, n-butyl, isobutyl, tert-butyl, n-pentyl, isopentyl, hexyl, cyclopentyl, and cyclohexyl. Preferably $R^2$ is hydrogen or methyl.

Letter a is a positive integer of 0 to 6, preferably 0 to 4, more preferably 0 to 2. Letter n is a positive integer of 1 to 40, preferably 1 to 20, more preferably 1 to 10, most preferably 2 to 8. Letter m is equal to 0 or 1.

Each of Rf and Rf' is a straight, branched or cyclic fluoroalkyl group having 1 to 12 carbon atoms, preferably 1 to 8 carbon atoms, more preferably 4 to 8 carbon atoms. This alkyl group may be either entirely substituted with fluorine atoms or partially with fluorine atoms, with the remainder being hydrogen atoms. Rf and Rf' may be the same or different. Exemplary groups are trifluoromethyl, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, perfluorododecyl, perfluoro-3-methylbutyl, perfluoro-5-methylhexyl, perfluoro-7-methyloctyl, perfluoro-9-methyldecyl, 2H-tetrafluoroethyl, 4H-octafluorobutyl, 6H-dodecafluorohexyl, 8H-hexadecafluorooctyl, 10H-icosafluorodecyl, 2H-hexafluoropropyl, 2-fluoroethyl, 1H-hexafluoroisopropyl, and 1,1-bis(trifluoromethyl)ethyl. Of these, preferred are perfluorobutyl, perfluorohexyl, perfluorooctyl, perfluorodecyl, perfluoro-3-methylbutyl, perfluoro-5-methylhexyl, perfluoro-7-methyloctyl, perfluoro-9-methyldecyl, 2H-tetrafluoroethyl, 4H-octafluorobutyl, 6H-dodecafluorohexyl, and 8H-hexadecafluorooctyl.

The fluorochemical surfactants of formula (1) are commercially available, for example, under the trade name of KH-10, KH-20, KH-30 and KH-40 from Asahi Glass K.K. It is preferable to use KH-20 and KH-30.

Preferably, the fluorochemical surfactant is blended in the resist composition in an amount of 10 to 2,000 parts, more preferably 50 to 700 parts by weight per million parts by weight of the composition. Less than 10 ppm of the fluorochemical surfactant would fail to achieve coating thickness uniformity and to prevent coating defects. More than 2,000 ppm of the fluorochemical surfactant can cause a drop of resolution.

The resist composition of the invention may be either positive or negative working. Components other than the fluorochemical surfactant may be well-known ones. The resist composition is preferably of the chemical amplification type adapted to be exposed to high-energy radiation having a wavelength of 500 nm or less, x-rays and electron beams. More preferably, it is a chemically amplified positive working resist composition comprising a base resin in the form of an alkali-insoluble or scarcely soluble resin having acidic functional groups protected with acid-labile groups so that the resin becomes alkali soluble when the acid-labile groups are eliminated, a photo-acid generator capable of generating acid upon exposure to deep UV, x-rays or electron beams, typically an organic solvent for dissolving these components, and optional additives such as a basic substance or acidic substance and a dissolution inhibitor. The resist composition may be a chemically amplified negative working resist composition comprising an alkali-soluble resin, a crosslinking agent having a group reactive with the alkali-soluble resin in an acidic condition, typically a methylol group, a photo-acid generator capable of generating acid upon exposure to deep UV, x-rays or electron beams, and an organic solvent for dissolving these components. A resist composition for g-line or i-line mainly composed of a novolak resin and a naphthoquinonediazide compound may be used.

The above-described fluorochemical surfactant is blended in the compositions.

Specifically, the invention is applicable to any desired one of a chemically amplified resist composition primarily comprising a polyhydroxystyrene protected with at least two acid-labile groups as described in JP-A 9-211866; a chemically amplified resist composition primarily comprising a polyhydroxystyrene protected with at least two acid-labile groups and acid-labile crosslinking groups as described in JP-A 11-190904; a chemically amplified resist composition primarily comprising a polyacrylic resin-polyhydroxystyrene copolymer protected with acid-labile groups as described in JP-A 6-266112; and a chemically amplified resist composition for exposure with an ArF excimer laser primarily comprising a polyacrylic resin or polycycloolefin resin.

The organic solvent used in the resist composition is not critical. Illustrative, non-limiting, examples of the organic solvent include ketones such as cyclohexanone and methyl-2-n-amylketone; alcohols such as 3-methoxy-butanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, and ethyl 3-ethoxypropionate. These solvents may be used alone or in admixture of two or more.

Also provided is a method for forming a resist pattern comprising the steps of (i) coating the above-described resist composition onto a substrate to form a coated film, (ii) heat treating the coated film and then exposing it to high-energy radiation having a wavelength of 500 nm or less, x-rays or electron beams through a photo mask, and (iii) optionally heat treating the exposed film and developing it with a developer.

To form a pattern using the chemically amplified positive resist composition of the invention, any well-known lithographic technique may be employed. For example, the resist composition is applied onto a substrate such as a silicon wafer as by spin coating, and pre-baked on a hot plate at 60 to 150° C. for 1 to 10 minutes, preferably at 80 to 120° C. for 1 to 5 minutes, thereby forming a resist film having a thickness of 0.3 to 5.0 μm. A mask for forming the desired pattern is then placed over the resist film, and the resist film is exposed to high-energy radiation such as deep-UV having a wavelength of 500 nm or less, preferably 300 nm or less, excimer laser beams and x-rays or electron beams, in a dose of about 1 to 200 $mJ/cm^2$, preferably about 10 to 100 $mJ/cm^2$. The film is then baked on a hot plate at 60 to 150° C. for 1 to 5 minutes, preferably at 80 to 120° C. for 1 to 3 minutes (post-exposure baking=PEB). Using a developer such as an aqueous base solution containing 0.1 to 5% by weight, preferably 2 to 3% by weight of tetramethylammonium hydroxide (TMAH), the film is developed by a conventional method such as dipping, puddling or spraying, followed by rinsing with pure water. In this way, a desired resist pattern is formed on the substrate. The resist compositions are best suited for fine patterning with actinic radiation, especially deep-UV radiation having a wavelength of 254 to 157 nm, excimer laser beams, x-rays and electron beams. If some steps are carried out under conditions outside the above-defined ranges, the process would fail to form the desired pattern.

In the case of negative resist compositions, the desired pattern can be formed by effecting steps (i), (ii) and (iii) in a conventional manner.

There has been described a resist composition comprising a specific fluorochemical surfactant, which can be applied onto a substrate to form a coating having improved thickness uniformity, free of defects, and wettable with an aqueous base developer. The composition has a good storage stability in that particles do not increase during storage in solution form. Additionally, the composition is sensitive to high-energy radiation and is improved in sensitivity, resolution and reproducibility. Moreover, the resulting pattern is less prone to overhang formation and has an excellent dimensional controllability. Because of these features, the inventive resist composition is appropriate as a micropatterning material in VLSI fabrication at the exposure wavelength of a KrF or ArF excimer laser.

EXAMPLE

Examples of the present invention are given below by way of illustration and not by way of limitation. All parts are by weight. Mw is a weight average molecular weight and TMAH is tetramethylammonium hydroxide.

1. Resist Formulation

Resist compositions A, B, C, D, and E formulated below were used as chemical amplification type positive working resist materials.

TABLE 1

| Resist composition A | Parts |
|---|---|
| polyhydroxystyrene having hydroxyl groups partially protected with 14 mol % 1-ethoxyethyl and 13 mol % tert-butoxycarbonyl, Mw = 11,000 | 80 |
| bis(cyclohexylsulfonyl)diazomethane | 5 |
| tributylamine | 0.125 |
| propylene glycol monomethyl ether acetate | 450 |

TABLE 2

| Resist composition B | Parts |
|---|---|
| polyhydroxystyrene having hydroxyl groups partially protected with 20 mol % 1-ethoxyethyl, 5 mol % tert-butoxycarbonyl, and crosslinked with 4 mol % 1.2-propane diol divinyl ether, Mw = 25.000 | 80 |
| triphenylsulfonium tosylate | 2 |
| salicylic acid | 1 |
| tributylamine | 0.125 |
| propylene glycol monomethyl ether acetate | 450 |

TABLE 3

| Resist composition C | Parts |
|---|---|
| poly[(t-butyl acrylate)-(hydroxystyrene)] copolymer (molar ratio 30/70), Mw = 10.000 | 80 |
| bis(cyclohexylsulfonyl)diazomethane | 5 |
| salicylic acid | 1 |
| tributylamine | 0.125 |
| propylene glycol monomethyl ether acetate | 450 |

TABLE 4

| Resist composition D | Parts |
|---|---|
| poly[(t-butyl methacrylate)-(methyl methacrylate)-(polymethacrylic acid)] copolymer (molar ratio 40/40/20), MW = 12,000) | 80 |
| triphenylsulfonium perfluorobutylsulfonate | 2 |
| tributylamine | 0.125 |
| mixture of propylene glycol monomethyl ether acetate and ethyl lactate in a ratio of 7/3 | 450 |

TABLE 5

| Resist composition E | Parts |
|---|---|
| poly[(t-butyl-5-norbornene-2-carboxylate)-(maleic anhydride)-(5-norbornene-2,3-dicarboxylic anhydride)] copolymer (molar ratio 30/50/20), Mw = 9,000 | 80 |
| triphenylsulfonium perfluorobutylsulfonate | 2 |
| tributylamine | 0.125 |
| cyclohexanone | 450 |

2. Surfactant

The surfactants used are shown below.

TABLE 6

| No. | Surfactant (Example) | Amount (ppm) |
|---|---|---|
| 1 | KH-20 (Asahi Glass K.K.) | 100 |
| 2 | KH-20 (Asahi Glass K.K.) | 300 |
| 3 | KH-20 (Asahi Glass K.K.) | 500 |
| 4 | KH-30 (Asahi Glass K.K.) | 300 |
| 5 | KH-40 (Asahi Glass K.K.) | 300 |

TABLE 7

| No. | Surfactant (Comparative Example) | Amount (ppm) |
|---|---|---|
| 6 | S-381 (Asahi Glass K.K.) | 300 |
| 7 | FC-430 (Sumitomo 3M K.K.) | 300 |

3. Contact Angle Measurement

An amount of each surfactant was added to the resist composition A, which was passed through a 0.1-μm Teflon filter. This resist solution was spin-coated onto a silicon wafer and baked on a hot plate at 100° C., for 90 seconds to form a resist film of 0.55 μm thick.

A droplet of a 2.38 wt % TMAH aqueous solution serving as a developer was applied onto the coated substrate. The contact angle of the TMAH solution with the surface of the resist film was measured using a contact angle meter. The results are shown in FIG. 1.

4. Application Test

A resist composition as shown in Tables 8 and 9 was passed through a 0.1-μm Teflon filter. This resist solution was spin-coated onto twenty 8-inch silicon wafers and baked on a hot plate at 100° C. for 90 seconds to form a resist film of 0.55 μm thick.

The frequency (%) of flecks generated on the twenty coated films was determined as one index of applicability. A smaller frequency of flecks indicates better applicability.

Film thickness was measured at 35 points spaced from the center of the wafer at a pitch of 5 mm in a direction parallel to the orientation flat. The range of variation of film thickness is used as another index of applicability. A smaller range indicates better applicability.

5. Anti-Foaming Ability and Storage Stability

A resist composition as shown in Tables 8 and 9 was passed through a 0.1-μm Teflon filter. Using a liquid particle counter KL-20 (Lion K.K.), the number of particles with a size of more than 0.3 μm in 1 ml of this resist solution was counted.

The number of particles in the solution which was allowed to stand for 8 hours after filtration is designated an initial value and used as an index of anti-foaming ability. A smaller number of particles indicates better anti-foaming ability.

While the solution was aged, the number of particles was inspected at intervals. The number of days passed when a count of 50 particles/ml was reached is used as an index of storage stability. A larger number of days indicates better storage stability.

6. Exposure Test

A resist composition as shown in Tables 8 and 9 was passed through a 0.1-μm Teflon filter. This resist solution was spin-coated onto a 8-inch silicon wafer and baked on a hot plate at 100° C. for 90 seconds to form a resist film of 0.55 μm thick.

Exposure was made on the resist film using a KrF excimer laser stepper (NSR-2005EX8A, from Nikon Corporation; NA=0.5) while changing the dose and focus. The exposed film was baked at 110° C. for 90 seconds and developed for 60 seconds with a 2.38% TMAH aqueous solution, thereby giving a positive pattern. Note that resist compositions D and E, which were essentially adapted for an ArF excimer laser, were evaluated by means of the KrF excimer laser stepper.

The resulting 0.22-μm line-and-space resist pattern was examined for focus margin and edge roughness. A greater focus margin indicates better resolution, and a smaller edge roughness indicates better resist pattern reproducibility.

The results are shown in Tables 8 and 9. Table 8 reports the results of Examples within the scope of the invention while Table 9 reports the results of Comparative Examples.

TABLE 8

| Resist composition | Surfactant | Frequency of coating flecks (%) | Range of film thickness variation (Å) | Initial particle number (/ml) | Storage stability (days) | Focus margin (μm) | Edge roughness (nm) |
|---|---|---|---|---|---|---|---|
| A | No. 2 | 0 | 10 | <5 | >120 | 0.8 | 5 |
| B | No. 2 | 0 | 8 | <5 | >120 | 1.0 | 5 |
| C | No. 2 | 0 | 12 | <5 | >120 | 0.8 | 7 |
| D | No. 2 | 0 | 12 | <5 | >120 | 0.8 | 7 |
| E | No. 2 | 0 | 15 | <5 | >120 | 0.8 | 6 |
| B | No. 1 | 0 | 10 | <5 | >120 | 1.0 | 6 |
| B | No. 3 | 0 | 10 | <5 | >120 | 1.2 | 4 |
| B | No. 4 | 0 | 11 | <5 | >120 | 1.1 | 6 |
| B | No. 5 | 0 | 13 | <5 | >120 | 1.1 | 6 |

TABLE 9

| Resist composition | Surfactant | Frequency of coating flecks (%) | Range of film thickness variation (Å) | Initial particle number (/ml) | Storage stability (days) | Focus margin (μm) | Edge roughness (nm) |
|---|---|---|---|---|---|---|---|
| A | No. 6 | 20 | 20 | 20 | 90 | 0.6 | 10 |
| B | No. 6 | 30 | 25 | 17 | 90 | 0.8 | 11 |
| C | No. 6 | 25 | 23 | 15 | 90 | 0.6 | 14 |
| D | No. 6 | 20 | 22 | 13 | 90 | 0.6 | 15 |
| E | No. 6 | 30 | 30 | 16 | 90 | 0.6 | 15 |
| A | No. 7 | 40 | 23 | 26 | 90 | 0.6 | 12 |
| B | No. 7 | 30 | 25 | 20 | 100 | 0.8 | 11 |
| C | No. 7 | 20 | 27 | 21 | 90 | 0.6 | 15 |
| D | No. 7 | 35 | 22 | 21 | 70 | 0.6 | 17 |
| E | No. 7 | 30 | 21 | 30 | 70 | 0.6 | 19 |

Japanese Patent Application No. 10-267855 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a base polymer and a fluorochemical surfactant which functions to reduce the contact angle at the interface between the surface of the resist composition coated onto a substrate and water or an aqueous base developer as the amount of the fluorochemical surfactant increases wherein said fluorochemical surfactant is of the following formula (1):

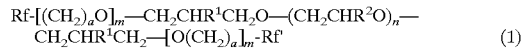

wherein $R^1$ is hydrogen, a hydroxyl group, a straight, branched or cyclic alkoxy group of 1–6 carbon atoms, or an alkylcarbonyloxy group whose alkyl moiety has 1–6 carbon atoms, $R^2$ is hydrogen or a straight, branched or cyclic alkyl group of 1–6 carbon atoms, a is a positive integer of 0–6, m is equal to 0 or 1, and n is a positive integer of 1–40, each of Rf and Rf', which may be the same or different, is a straight, branched or cyclic fluoroalkyl group having 1–12 carbon atoms, in which all groups attached to its carbon atoms are fluorine atoms or some are fluorine atoms and the remainder are hydrogen atoms.

2. The resist composition of claim 1, which is of chemical amplification type and to be exposed to high-energy radiation having a wavelength of 500 nm or less, x-rays or electron beams.

3. The resist composition of claim 1 wherein $R^1$ is a hydroxyl, methoxy or acetoxy.

4. The resist composition of claim 1 wherein $R^2$ a hydrogen or methyl.

5. The resist composition of claim 1 wherein a is a positive integer of 0–2.

6. The resist composition of claim 1 wherein n is a positive integer of 2–8.

7. The resist composition of claim 1 wherein Rf and Rf' are, independently, perfluorobutyl, perfluorohexyl, perfluorooctyl, perfluorodecyl, perfluoro-3-methylbutyl, perfluoro-5-methylhexyl, perfluoro-7-methyloctyl, perfluoro-9-methyldecyl, 2H-tetrafluoroethyl, 4H-octafluorobutyl, 6H-dodecafluorohexyl, or 8H-hexadecafluorooctyl.

8. The resist composition of claim 1 wherein the fluorochemical surfactant is blended in the resist composition in an amount of 10 to 2,000 parts by weight per million parts by weight of the composition.

9. The resist composition of claim 1 wherein the fluorochemical surfactant is blended in the resist composition in an amount of 50 to 700 parts by weight per million parts by weight of the composition.

10. The resist composition of claim 1 wherein the base polymer is polyhydroxystyrene, poly[(t-butyl acrylate)-(hydroxystyrene)]copolymer, poly[(t-butyl methacrylate)-(methyl methacrylate)-(polymethacrylic acid)]copolymer, or poly[(t-butyl-5-norbornene-2-carboxylate)-(maleic anhydride)-(5-norbornene-2,3-dicarboxylic anhydride)]copolymer.

11. A chemically amplified positive working resist composition comprising:

a base resin of an alkali-insoluble or scarcely soluble resin having acidic functional groups protected with acid-labile groups wherein the resin becomes alkali soluble when the acid-labile groups are eliminated;

a photo-acid generator capable of generating acid upon exposure to deep UV, X-rays or electron beams; and a fluorochemical surfactant functioning to reduce the contact angle at the interface between the surface of the resist composition coated onto a substrate and water or an aqueous base developer as the amount of the fluorochemical surfactant increases wherein said fluorochemical surfactant is of the formula (1):

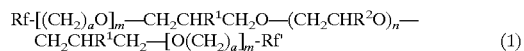 (1)

wherein $R^1$ is hydrogen, a hydroxyl group, a straight, branched or cyclic alkoxy group of 1–6 carbon atoms, or an alkylcarbonyloxy group whose alkyl moiety has 1–6 carbon atoms, $R^2$ is hydrogen or a straight, branched or cyclic alkyl group of 1–6 carbon atoms, a is a positive integer of 0–6, m is equal to 0 or 1, and n is a positive integer of 1–40, each of Rf and Rf', which may be the same or different, is a straight, branched or cyclic fluoroalkyl group having 1–12 carbon atoms, wherein all groups attached to its carbon atoms are fluorine atoms or some are fluorine atoms and the remainder are hydrogen atoms.

12. A resist composition for g-line or i-line comprising:

a novolak resin;

a naphthoquinonediazide compound; and a fluorochemical surfactant functioning to reduce the contact angle at the interface between the surface of the resist composition coated onto a substrate and water or an aqueous base developer as the amount of the fluorochemical surfactant increases.

wherein said fluorochemical surfactant is of the following formula (1):

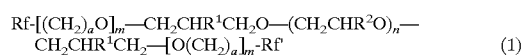 (1)

wherein R is hydrogen, a hydroxyl group, a straight, branched or cyclic alkoxy group of 1–6 carbon atoms, or an alkylcarbonyloxy group whose alkyl moiety has 1–6 carbon atoms, $R^2$ is hydrogen or a straight, branched or cyclic alkyl group of 1–6 carbon atoms, a is a positive integer of 0–6, m is equal to 0 or 1, and n is a positive integer of 1–40, each of Rf and Rf', which may be the same or different, is a straight, branched or cyclic fluoroalkyl group having 1–12 carbon atoms, in which all groups attached to its carbon atoms are fluorine atoms or some are fluorine atoms and the remainder are hydrogen atoms.

* * * * *